(12) United States Patent
Böhm et al.

(10) Patent No.: US 12,708,047 B2
(45) Date of Patent: Aug. 11, 2026

(54) POWER SEMICONDUCTOR PACKAGE AND METHOD FOR FABRICATING THE SAME

(71) Applicant: Infineon Technologies Austria AG, Villach (AT)

(72) Inventors: Marcus Böhm, Mintraching (DE); Stefan Wötzel, Erfurt (DE); Andreas Grassmann, Sinzing (DE); Bernd Schmoelzer, Radenthein (AT); Uwe Schindler, Reichenbach (DE)

(73) Assignee: Infineon Technologies Austria AG, Villach (AT)

( * ) Notice: Subject to any disclaimer, the term of this patent is extended or adjusted under 35 U.S.C. 154(b) by 383 days.

(21) Appl. No.: 18/388,559

(22) Filed: Nov. 10, 2023

(65) Prior Publication Data

US 2024/0162205 A1 May 16, 2024

(30) Foreign Application Priority Data

Nov. 10, 2022 (EP) .................................... 22206519

(51) Int. Cl.
*H01L 23/00* (2006.01)
*H10W 70/40* (2026.01)
*H10W 74/01* (2026.01)
*H10W 74/10* (2026.01)
*H10W 90/00* (2026.01)

(52) U.S. Cl.
CPC .......... *H10W 90/00* (2026.01); *H10W 70/411* (2026.01); *H10W 70/464* (2026.01); *H10W 70/481* (2026.01); *H10W 74/016* (2026.01); *H10W 74/111* (2026.01); *H10W 90/763* (2026.01); *H10W 90/766* (2026.01)

(58) Field of Classification Search
CPC ......... H01L 21/565; H01L 2224/40137; H01L 2224/40257; H01L 23/3107; H01L 23/49503; H01L 23/49517; H01L 23/49562; H01L 23/49575; H01L 24/40; H01L 25/16; H01L 2924/1203
See application file for complete search history.

(56) References Cited

U.S. PATENT DOCUMENTS

2005/0151236 A1 7/2005 Oliver et al.
2007/0216011 A1 * 9/2007 Otremba ............. H10W 90/811 257/E23.044

(Continued)

FOREIGN PATENT DOCUMENTS

JP H0982879 3/1997

*Primary Examiner* — Jaehwan Oh
(74) *Attorney, Agent, or Firm* — Dicke, Billig & Czaja, PLLC

(57) ABSTRACT

A power semiconductor package comprises a leadframe comprising a first die pad, a second die pad and a plurality of external contacts. The first and second die pads are separated by a first gap. A power semiconductor die is arranged on and electrically coupled to a first side of the first die pad. A diode is arranged on and electrically coupled to a first side of the second die pad. A molded body encapsulates the power semiconductor die and the diode, the molded body having a first side, an opposite second side and lateral sides connecting the first and second sides. A second side of the first die pad is exposed from the second side of the molded body. A second side of the second die pad is completely covered by an electrically insulating material.

20 Claims, 4 Drawing Sheets

(56) References Cited

U.S. PATENT DOCUMENTS

| | | | | |
|---|---|---|---|---|
| 2009/0127681 | A1* | 5/2009 | Son | H10W 90/811 257/E23.036 |
| 2009/0174046 | A1* | 7/2009 | Liu | H10W 70/442 257/676 |
| 2010/0001291 | A1* | 1/2010 | Otremba | H10W 70/427 257/E23.18 |
| 2010/0084750 | A1* | 4/2010 | Lotfi | H10W 70/40 257/676 |
| 2010/0230799 | A1* | 9/2010 | Beng Keh | H10W 74/014 257/E23.06 |
| 2013/0043574 | A1* | 2/2013 | Williams | H10W 70/411 257/676 |
| 2015/0221581 | A1 | 8/2015 | Koji | |
| 2015/0235999 | A1 | 8/2015 | Dinkar | |
| 2016/0118320 | A1 | 4/2016 | Vito | |
| 2016/0343644 | A1 | 11/2016 | Kawashima et al. | |
| 2020/0294885 | A1* | 9/2020 | Fuergut | H10W 40/611 |
| 2020/0402894 | A1 | 12/2020 | Tianyi | |
| 2023/0197577 | A1* | 6/2023 | Scharf | H10W 70/421 257/666 |
| 2023/0335474 | A1* | 10/2023 | Niu | H10W 70/468 |

* cited by examiner 400
410
420
440
430

POWER SEMICONDUCTOR PACKAGE AND METHOD FOR FABRICATING THE SAME

CROSS-REFERENCE TO RELATED APPLICATION

This Utility Patent Application claims priority to European Patent Application No. 22206519.5 filed Nov. 10, 2022, which is incorporated herein by reference.

TECHNICAL FIELD

This disclosure relates in general to a power semiconductor package as well as to a method for fabricating such a power semiconductor package.

BACKGROUND

Power semiconductor packages may comprise components which during operation have greatly differing electrical potentials. It may be desirable to electrically isolate components with a high potential from external parts like e.g. a heatsink. On the other hand, a power semiconductor package may generate a considerable amount of heat during operation. It may therefore be desirable to provide a heat dissipation pathway with as low a thermal resistance as possible. Electrically isolating components however have an increased thermal resistance compared to conductive components. Furthermore, elaborate isolation concepts may increase the costs of power semiconductor packages. Improved power semiconductor packages as well as improved methods for fabricating a power semiconductor package may help with solving these and other problems.

The problem on which the invention is based is solved by the features of the independent claims. Further advantageous examples are described in the dependent claims.

SUMMARY

Various aspects pertain to a power semiconductor package, comprising: a leadframe comprising a first die pad, a second die pad and a plurality of external contacts, wherein the first and second die pads are separated by a first gap, a power semiconductor die arranged on and electrically coupled to a first side of the first die pad, a diode arranged on and electrically coupled to a first side of the second die pad, and a molded body encapsulating the power semiconductor die and the diode, the molded body having a first side, an opposite second side and lateral sides connecting the first and second sides, wherein a second side of the first die pad opposite the first side of the first die pad is exposed from the second side of the molded body and wherein a second side of the second die pad opposite the first side of the second die pad is completely covered by an electrically insulating material.

Various aspects pertain to a method for fabricating a power semiconductor package, the method comprising: providing a leadframe which comprises a first die pad, a second die pad and a plurality of external contacts, wherein the first and second die pads are separated by a first gap, arranging a power semiconductor die on a first side of the first die pad and electrically coupling the power semiconductor die to the first side of the first die pad, arranging a diode on a first side of the second die pad and electrically coupling the diode to the first side of the second die pad, encapsulating the power semiconductor die and the diode with a molded body, the molded body having a first side, an opposite second side and lateral sides connecting the first and second sides, such that a second side of the first die pad opposite the first side of the first die pad is exposed from the second side of the molded body, and completely covering a second side of the second die pad opposite the first side of the second die pad with an electrically insulating material.

BRIEF DESCRIPTION OF THE DRAWINGS

The accompanying drawings illustrate examples and together with the description serve to explain principles of the disclosure. Other examples and many of the intended advantages of the disclosure will be readily appreciated in view of the following detailed description. The elements of the drawings are not necessarily to scale relative to each other. Identical reference numerals designate corresponding similar parts.

DETAILED DESCRIPTION

Figure 1A:
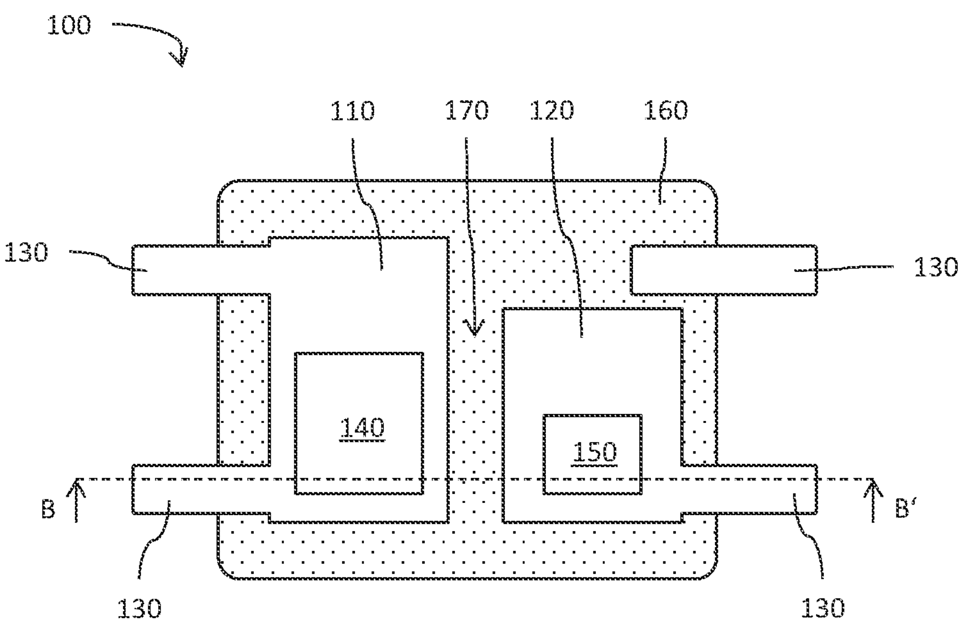
FIGS. 1A and 1B show a power semiconductor package comprising a first and a second die pad, wherein the first die pad is exposed from a side of a molded body of the power semiconductor package and wherein the second die pad is completely covered by the electrically isolating material at this side of the molded body.

In the following detailed description, reference is made to the accompanying drawings. It may be evident, however, to one skilled in the art that one or more aspects of the disclosure may be practiced with a lesser degree of the specific details. In other instances, known structures and elements are shown in schematic form in order to facilitate describing one or more aspects of the disclosure. In this regard, directional terminology, such as “top”, “bottom”, “left”, “right”, “upper”, “lower” etc., is used with reference to the orientation of the Figure(s) being described. Because components of the disclosure can be positioned in a number of different orientations, the directional terminology is used for purposes of illustration only.

In addition, while a particular feature or aspect of an example may be disclosed with respect to only one of several implementations, such feature or aspect may be combined with one or more other features or aspects of the other implementations as may be desired and advantageous for any given or particular application, unless specifically noted otherwise or unless technically restricted. Furthermore, to the extent that the terms “include”, “have”, “with” or other variants thereof are used in either the detailed description or the claims, such terms are intended to be inclusive in a manner similar to the term “comprise”. The terms “coupled” and “connected”, along with derivatives thereof may be used. It should be understood that these terms may be used to indicate that two elements cooperate or interact with each other regardless whether they are in direct physical or electrical contact, or they are not in direct contact with each other; intervening elements or layers may be provided between the “bonded”, “attached”, or “connected" elements. However, it is also possible that the "bonded", "attached", or "connected" elements are in direct contact with each other. Also, the term "exemplary" is merely meant as an example, rather than the best or optimal.

The examples of a power semiconductor package described below may use various types of semiconductor dies or circuits incorporated in the semiconductor dies, among them AC/DC or DC/DC converter circuits, power MOS transistors, power Schottky diodes, JFETs (Junction Gate Field Effect Transistors), power bipolar transistors, logic integrated circuits, analogue integrated circuits, mixed signal integrated circuits, sensor circuits, power integrated circuits, etc. The examples may also use semiconductor dies comprising MOS transistor structures or vertical transistor structures like, for example, IGBT (Insulated Gate Bipolar Transistor) structures or, in general, transistor structures in which at least one electrical contact pad is arranged on a first main face of the semiconductor die and at least one other electrical contact pad is arranged on a second main face of the semiconductor die, opposite to the first main face of the semiconductor die.

An efficient power semiconductor package as well as an efficient method for fabricating a power semiconductor package may for example reduce material consumption, ohmic losses, chemical waste, etc. and may thus enable energy and/or resource savings. Improved power semiconductor packages and improved methods for fabricating a power semiconductor package, as specified in this description, may thus at least indirectly contribute to green technology solutions, i.e. climate-friendly solutions providing a mitigation of energy and/or resource use.

Figure 1B:
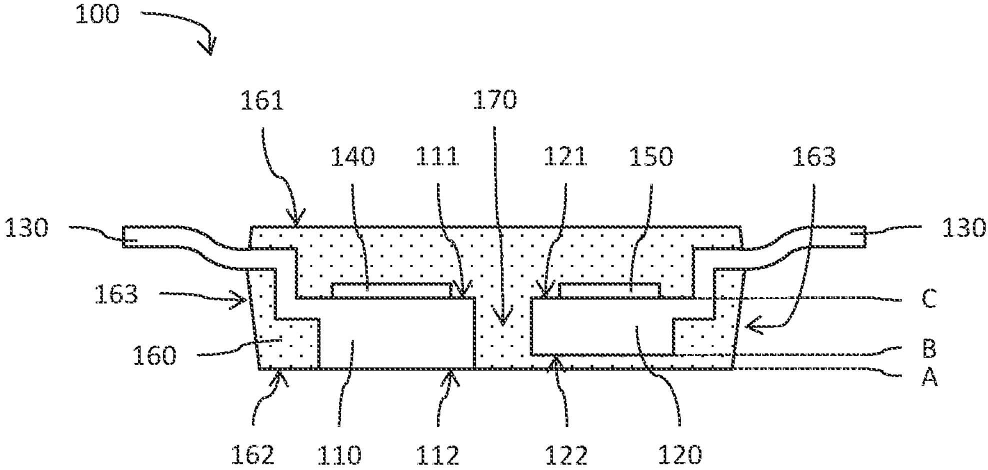

FIGS. 1A and 1B show a power semiconductor package 100 comprising a leadframe with a first die pad 110, a second die pad 120 and a plurality of external contacts 130. The power semiconductor package 100 further comprises a power semiconductor die 140, a diode 150 and a molded body 160. FIG. 1A shows a plan view of the power semiconductor package 100 (the molded body 160 is transparent in order to show the interior of the package) and FIG. 1B shows a sectional view along the line B-B' in FIG. 1A.

The power semiconductor package 100 may be configured to operate with a high voltage and/or a strong electrical current. The power semiconductor package 100 may for example be configured to operate with a voltage of about 650V or more, or 1.2 kV or more.

The power semiconductor package 100 may comprise any suitable electrical circuit and may be used in any suitable application. The power semiconductor package 100 may for example be part of a power factor correction (PFC) circuit. The power semiconductor package 100 may for example be used in a solar inverter application.

The first die pad 110, the second die pad 120 and the external contacts 130 may in particular be part of the same leadframe. However, it is also possible that one or more of these components are part of a different leadframe. The leadframe or the leadframes may comprise or consist of any suitable metal or metal alloy. The leadframe(s) may e.g. comprise or consist of Al, Cu or Fe. According to an example, the leadframe(s) may be plated. The plating may e.g. comprise or consist of Au, Ti, W or Ni.

The first die pad 110 may be configured to act as a carrier for a first semiconductor die, e.g. the power semiconductor die 140, and the second die pad 120 may be configured to act as a carrier for a second semiconductor die, e.g. the diode 150. It is however also possible that the first die pad 110 and/or the second die pad 120 are configured to act as a carrier for more than one semiconductor die.

The first die pad 110 may comprise a first side 111 and an opposing second side 112. Likewise, the second die pad 120 may comprise a first side 121 and an opposing second side 122. The first die pad 110 may have any suitable thickness, the thickness being measured between the first and second sides 111, 112. The first die pad 110 may for example have a thickness in the range of about 0.5 mm to about 5 mm. The lower limit of this range may also be about 0.7 mm, about 1 mm, or about 2 mm and the upper limit may also be about 4 mm or about 3 mm. The second die pad 120 may have a thickness which is smaller than the thickness of the first die pad 110. The second die pad 120 may e.g. have a thickness which is about 0.1 mm, or about 0.2 mm, or about 0.3 mm, or about 0.5 mm smaller than the thickness of the first die pad 110. However, it is also possible that the first and second die pads 110, 120 have the same thickness.

According to an example, fabricating the second die pad 120 comprises applying a thinning process to the die pad. The thinning process may e.g. comprise one or more of rolling, milling and stamping the die pad in order to obtain a reduced thickness compared to the thickness of the first die pad 110.

According to an example, the second side 112 of the first die pad 110 may be arranged in a first plane (plane A in FIG. 1B) and the second side 122 of the second die pad 120 is arranged in a different second plane (plane B in FIG. 1B). In this case, the distance between the planes A and B corresponds to the difference in thickness between the first and second die pads 110, 120. Tuning of the distance between planes A and B may require a trade-off decision between the insulation quality and material choice of the mold compound on the one hand (thicker gaps allow better insulation and usage of mold compounds with larger (cheaper) filler particles) and the thermal package performance on the other hand (thinner gaps provide better cooling paths to the heatsink 310). Furthermore, the first sides 111, 121 of the first and second die pads 110, 120 may be arranged coplanar in a third plane (plane C). It is however also possible that the first sides 111, 121 are not coplanar.

The first and second die pads 110, 120 are separated by a first gap 170. This may in particular mean that the first and second die pads 110, 120 are not in direct physical contact with one another. Furthermore, this may mean that the first and second die pads 110, 120 are not in direct electrical contact with one another. In other words, the first gap 170 may physically and electrically separate the first and second die pads 110, 120 from one another.

The power semiconductor die 140 and the diode 150 and/or the first and second die pads 110, 120 may be electrically coupled to one another via electrical connectors like bond wires, ribbons or contact clips (not shown in FIGS. 1A and 1B).

The first gap 170 may have any suitable width (the width being the distance between the die pads 110, 120). For example, the width of the first gap 170 may be 0.2 mm or more, or 0.4 mm or more, or 0.6 mm or more, or 0.8 mm or more, or 1 mm or more, or 1.5 mm or more, or 3 mm or more, or 5 mm or more, or 10 mm or more.

According to an example, the first gap 170 is filled with electrically insulating material. The first gap 170 may for example be filled with mold material of the molded body 160. It is however also possible that a different material than the mold material of the molded body 160 partially or completely fills the first gap 170. For example, a dielectric connector piece may be arranged in the first gap 170, wherein the connector piece is configured to mechanically couple the first and second die pads 110, 120 (e.g. during fabrication of the power semiconductor package 100).

The power semiconductor die 140 is arranged on and electrically coupled to the first side 111 of the first die pad 110. The diode 150 is arranged on and electrically coupled to the first side 121 of the second die pad 120. The power semiconductor die 140 may for example be a MOSFET or an IGBT or HEMT (high electron mobility transistor). The power semiconductor die 140 may e.g. be mounted on the first die carrier 110 in a flip chip configuration, in particular a "source-down" configuration. The power semiconductor die 140 and the diode 150 may be coupled to the first and second die pads 110, 120 via "standard" soldered joints or diffusion soldered joints or sintered joints. According to an example, no semiconductor dies are arranged over the second sides 112, 122 of the die pads 110, 120.

According to an example, the power semiconductor die 140 is mounted on the first die pad 110 in a "source down" configuration, wherein a source electrode faces the first side 111 of the first die pad 110. A drain electrode may be arranged on the upper side of the power semiconductor die 140 and may face away from the first die pad 110.

The molded body 160 encapsulates the power semiconductor die 140 and the diode 150. The molded body 160 has a first side 161, an opposite second side 162 and lateral sides 163 connecting the first and second sides 161, 162. The molded body 160 may comprise or consist of any suitable mold material. The molded body 160 may comprise filler particles, e.g. inorganic particles configured to reduce the thermal resistance of the molded body 160. The molded body 160 may for example be fabricated using compression molding, injection molding or transfer molding.

The external contacts 130 may be exposed from one or more of the lateral sides 163 of the molded body 160. For example, external contacts 130 may be arranged along two opposite lateral sides 163 of the molded body 160. An arrangement of external contacts 130 to all four lateral sides 163 is also conceivable. As shown in FIGS. 1A and 1B, one or more of the external contacts 130 may be contiguous with the first die pad 110 (i.e. the respective external contact and the die pad are a single piece) and/or one or more of the external contacts may be contiguous with the second die pad 120. It is of course also possible that no external contact 130 is contiguous with the first and/or the second die pad 110, 120.

According to an example, a distance between a plane which comprises the second side 162 of the molded body 160 and a parallel further plane, wherein the external contacts 130 are exposed from the lateral sides 163 of the molded body 160 in the further plane, is about 1 mm or more, or about 2 mm or more, or about 3 mm or more, or about 3.4 mm. Furthermore, the lateral sides 163 may be shaped such that a creepage distance between these two planes is about 3 mm or more, or about 4 mm or more, or about 5 mm, or about 7 mm or more.

The second side 112 of the first die pad 110 is exposed from the second side 162 of the molded body 160. The second side 112 of the first die pad 110 may in particular be partially or completely exposed from the molded body 160. The second side 122 of the second die pad 120 is completely covered by an electrically insulating material.

According to an example, the electrically insulating material is the mold material of the molded body 160 (this example is shown in FIG. 1B). In other words, in this case the second side 122 of the second die pad 120 is completely covered by the molded body 120.

According to another example, the electrically insulating material is a material that is different from the mold material of the molded body 160. The electrically insulating material may for example comprise or consist of a polymer, a laminate, a coating, a thermal interface material (TIM), a preform, a plastic, etc.

The electrically insulating material may be configured to electrically insulate the second die pad 120 at the second side 162 of the molded body 160. The electrically insulating material may e.g. be configured to insulate the second die pad 120 at the second side 162 of the molded body 160 against a voltage difference of 100V or more, or 500V or more, or 1 kV or more, or 1.2 kV or more, or 2 kV or more.

According to an example, during operation of the power semiconductor package 100 the first die pad 110 is at ground (GND) potential. The second die pad 120 on the other hand may be at a high potential, e.g. 100V or more, or 500V or more, or 1 kV or more, or 1.2 kV or more, or 2 kV or more. The second side 162 of the molded body 160 may be configured to be arranged on a heatsink. The heatsink may be joined with the the second side 112 of the first die pad 110 by joining methods, e.g., by soldering or welding. Such a joint without any dielectric material between the first die pad 110 and the heatsink may provide a heat dissipation path with a low thermal resistance. Since the first die pad 110 is at a low potential, e.g. at GND potential, it is not problematic that the heatsink is electrically coupled to the first die pad 110. Since the second die pad 120 however is at a high potential, it may be necessary to electrically insulate it from the heatsink.

Using the mold material of the molded body 160 as electrical insulation between the second die pad 120 and the heatsink may be more cost efficient than providing a separate insulation.

Figure 2A:
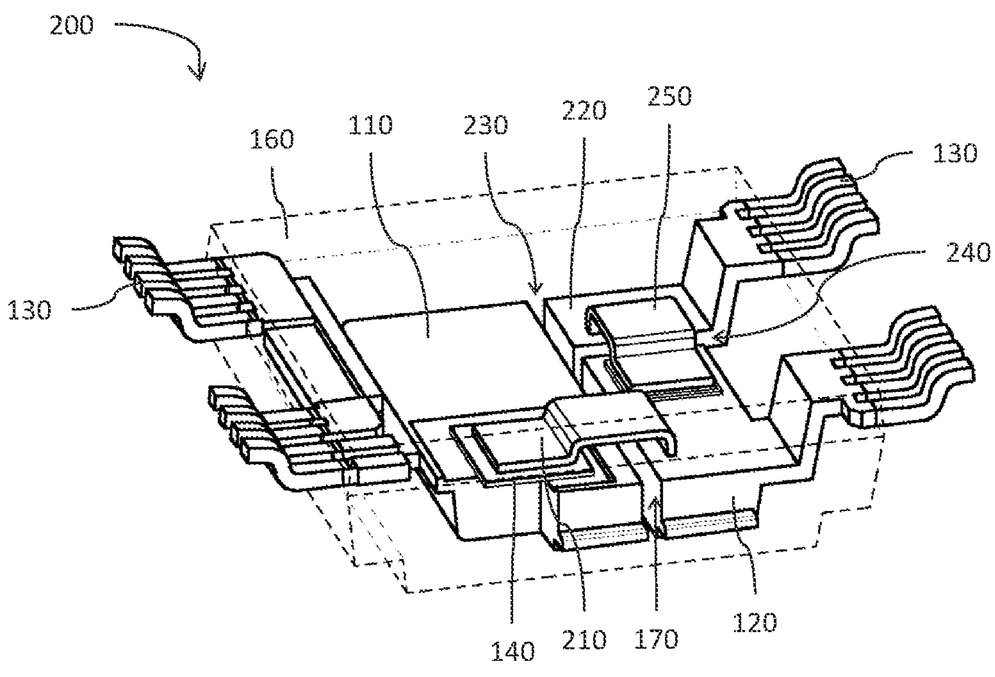
FIGS. 2A and 2B show a further power semiconductor package which comprises the first and the second die pads and which further comprises an optional third die pad.
Figure 2B:
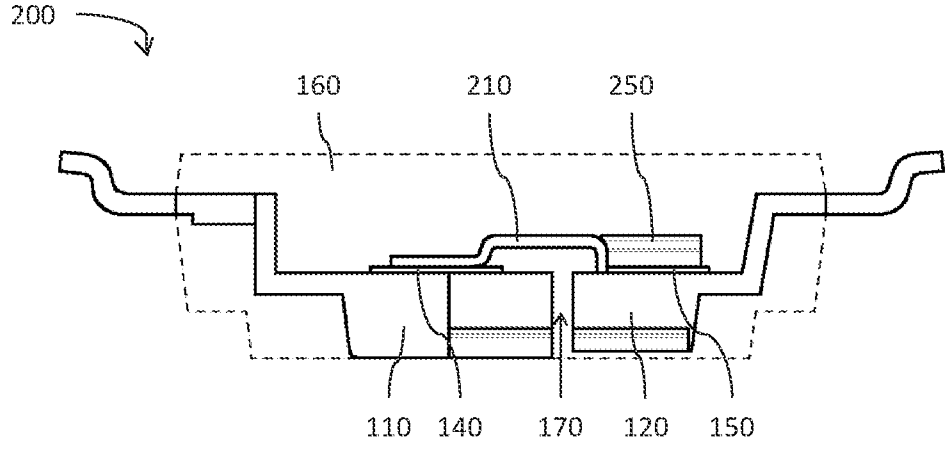

FIGS. 2A and 2B show a further power semiconductor package 200 which may be similar or identical to the power semiconductor package 100, except for the differences described in the following. FIG. 2A shows a perspective view and FIG. 2B shows a side view.

As shown in FIG. 2A, the power semiconductor package 200 may comprise a first electrical connector 210 which couples the power semiconductor die 140 to the diode 150. In particular, the first electrical connector 210 may be coupled to an upper side of the power semiconductor die 140 and to the first side 121 of the second die pad 120. The first electrical connector 210 may in particular be coupled to a power electrode, e.g. a drain electrode or a collector electrode, on the upper side of the power semiconductor die 140. The first electrical connector 210 may e.g. comprise or consist of a contact clip, a bond wire or a ribbon.

According to an example, the power semiconductor package 200 comprises the first and second die pads 110, 120 and it further comprises a third pad 220. The third die pad 220 may be separated from the first die pad 110 by a second gap 230 and it may be separated from the second die pad 120 by a third gap 240.

According to an example, the second gap 230 is an extension, e.g. a straight extension, of the first gap 170 (compare FIG. 2A). According to an example, the third gap 240 is arranged essentially perpendicular to the first gap 170 and/or the second gap 230. The first, second and third gaps 170, 230 and 240 may essentially form a T-junction (compare FIG. 2A).

The third die pad 220 may comprise or consist of the same material as described with respect to the first and second die pads 110, 120. The third die pad 220 may be part of the same leadframe as the first die pad 110 and/or the second die pad 120. The third die pad 220 may e.g. have the same thickness as the second die pad 120.

The third die pad 220 may comprise a first side and an opposite second side. The first side may be coplanar with the first sides 111, 121 of the first and second die pads 110, 120. The second side of the third die pad 220 may be coplanar with the second side 122 of the second die pad 120.

According to an example, the third die pad 220 is covered by electrically insulating material (e.g. the mold material of the molded body 160) at the second side 162 of the molded body 160, similar to the second die pad 120. According to an example, the third die pad 220 does not carry any semiconductor die or diode and instead acts as connector for external contacts 130 (compare FIG. 2A). The external contact(s) 130 coupled to the first die pad 110 may e.g. be configured as input terminals of the power semiconductor package 200. The external contact(s) 130 coupled to the third die pad 220 may e.g. be configured as output terminals of the power semiconductor package 200.

The power semiconductor package 200 may comprise a second electrical connector 250 coupling the diode 150 to the third die pad 220. In particular, the second electrical connector 250 may be coupled to an electrode on the upper side of the diode 150 and to the first side of the third die pad 220. The second electrical connector 250 may e.g. comprise or consist of a contact clip, a bond wire or a ribbon.

As shown in FIG. 2A, the power semiconductor die 140 may be arranged on the first die pad 110 such that the power semiconductor die 140 partially overhangs. The power semiconductor die 140 may comprise an electrode, e.g. a gate electrode, on the overhanging part of its lower side. In this manner, this electrode can be contacted, e.g. using a bond wire. The first die pad 110 may comprise a cutout section, wherein the power semiconductor die 140 overhangs in the cutout section.

Figures 3, 4:
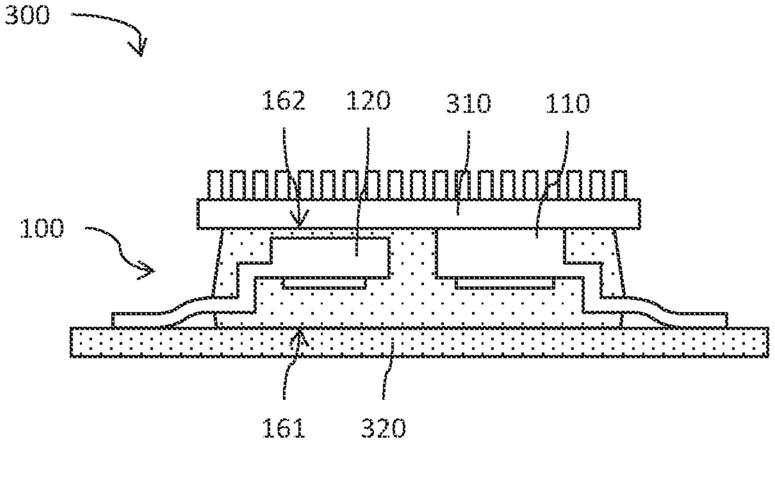
FIG. 3 shows an electronics system comprising a power semiconductor package, a heatsink and an application board.
FIG. 4 shows an example for an electrical circuit, wherein a part of this electrical circuit may be realized using a power semiconductor package as described herein.

FIG. 3 shows an electronics system 300 comprising the power semiconductor package 100, a heatsink 310 and an application board 320. According to another example, the electronics system comprises the power semiconductor package 200 instead of the power semiconductor package 100.

The heatsink 310 is arranged at the second side 162 of the molded body 160 and the application board 320 is arranged at the first side 161 of the molded body 160. As shown in FIG. 3, the electrically insulating material isolates the second die pad 120 from the heatsink 310. The heatsink 310 may e.g. be coupled to the first die pad 110 by one or more of soldering, welding, mechanical fixing, gluing with conductive glue, etc. According to an example, a layer of thermal interface material (TIM) may be arranged between the power semiconductor package 100 or 200 and the heatsink 310. In this case, the layer of TIM may in particular be arranged between the first die pad 110 and the heatsink 310 as well as between the second die pad 120 and the heatsink. According to an example, if the second die pad 120 is already insulated, e.g. by mold compound, the TIM sheet may be electrically conductive. This may offer advantages in terms of cost and thermal conductivity (for example, in this case the TIM can be a simple Al foil). If there is no insulation over the second die pad 120 at the second side 162 after molding (i.e. there is a hole left in the mold body during molding at the second side 162) a liquid, insulating gap filler may be dispensed in this hole in the mold. In this case, again a cheap and thermally performant electrically conductive TIM may be applied. According to another example, a generic liquid (which is electrically insulating) could be applied as gap filler for the topping up of the left mold hole over the second die pad 120 at the second side 162 The generic liquid may in this case be used as a wide TIM layer which may essentially cover the whole package at the second side 162.

As shown in FIG. 3, the power semiconductor package 100 or 200 may be a surface mount device (SMD) configured to be surface mounted onto the application board 320. However, it is also possible that the semiconductor package 100 or 200 is a through hole device (THD).

FIG. 4 shows an exemplary electrical circuit 400, wherein the semiconductor package 100 or 200 may be used in a part 410 of this electrical circuit 400. The electrical circuit 400 may for example comprise a power factor correction circuit of e.g. a solar inverter.

The electrical circuit 400 may comprise the part 410 which may be realized using the semiconductor package 100 or 200 and it may also comprise a variable voltage source 420, a DC/DC converter 430 and a load 440.

Figure 5:
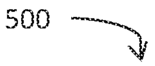
FIG. 5 is a flow chart of a method for fabricating a power semiconductor package.
Figure 5:
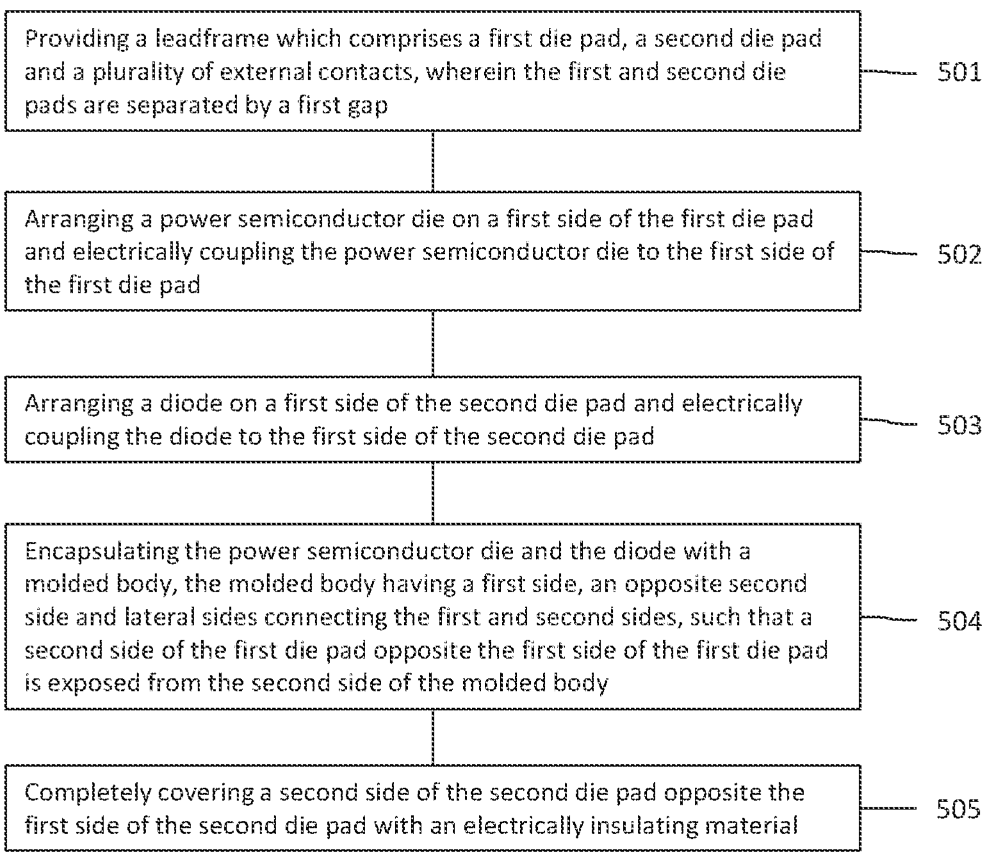

FIG. 5 is a flow chart of an exemplary method 500 for fabricating a power semiconductor package. The method 500 may for example be used to fabricate the power semiconductor packages 100 and 200.

The method 500 comprises at 501 a process of providing a leadframe which comprises a first die pad, a second die pad and a plurality of external contacts, wherein the first and second die pads are separated by a first gap, at 502 a process of arranging a power semiconductor die on a first side of the first die pad and electrically coupling the power semiconductor die to the first side of the first die pad, at 503 a process of arranging a diode on a first side of the second die pad and electrically coupling the diode to the first side of the second die pad, at 504 a process of encapsulating the power semiconductor die and the diode with a molded body, the molded body having a first side, an opposite second side and lateral sides connecting the first and second sides, such that a second side of the first die pad opposite the first side of the first die pad is exposed from the second side of the molded body, and at 505 a process of completely covering a second side of the second die pad opposite the first side of the second die pad with an electrically insulating material. According to an example, process 504 and 505 are conducted as a single process, for example through a single mold process.

Examples

In the following, the power semiconductor package and the method for fabricating a power semiconductor package are further explained using specific examples.

Example 1 is a power semiconductor package, comprising: a leadframe comprising a first die pad, a second die pad and a plurality of external contacts, wherein the first and second die pads are separated by a first gap, a power semiconductor die arranged on and electrically coupled to a first side of the first die pad, a diode arranged on and electrically coupled to a first side of the second die pad, and a molded body encapsulating the power semiconductor die and the diode, the molded body having a first side, an opposite second side and lateral sides connecting the first and second sides, wherein a second side of the first die pad opposite the first side of the first die pad is exposed from the second side of the molded body and wherein a second side of the second die pad opposite the first side of the second die pad is completely covered by an electrically insulating material.

Example 2 is the power semiconductor package of example 1, wherein the insulating material is a mold material of the molded body.

Example 3 is the power semiconductor package of example 1, wherein the electrically insulating material is different from a mold material of the molded body.

Example 4 is the power semiconductor package of one of the preceding examples, wherein the first sides of the first and second die pad are coplanar.

Example 5 is the power semiconductor package of one of the preceding examples, wherein the second side of the first die pad is arranged in a first plane and the second side of the second die pad is arranged in a different, second plane.

Example 6 is the power semiconductor package of one of the preceding examples, wherein the external contacts are exposed from two opposite lateral sides of the molded body.

Example 7 is the power semiconductor package of one of the preceding examples, wherein a first one of the external contacts is contiguous with the first die pad and a second one of the external contacts is contiguous with the second die pad.

Example 8 is the power semiconductor package of one of the preceding examples, wherein the power semiconductor die comprises a first side and an opposite second side, wherein the second side faces the first side of the first die pad, and wherein a first electrical connector couples the first side of the power semiconductor die to the first side of the second die pad.

Example 9 is the power semiconductor package of one of the preceding examples, wherein the leadframe further comprises a third die pad separated from the first die pad by a second gap and separated from the second die pad by a third gap.

Example 10 is the power semiconductor package of example 9, wherein the diode comprises a first side and an opposite second side, wherein the second side faces the first side of the second die pad, and wherein a second electrical connector couples the first side of the diode to a first side of the third die pad.

Example 11 is the power semiconductor package of example 9 or 10, wherein a third one of the external contacts is contiguous with the third pad.

Example 12 is the power semiconductor package of one of the preceding examples, wherein the power semiconductor die is coupled to the first die pad in a flip-chip configuration such that a source electrode of the power semiconductor die faces the first die pad.

Example 13 is the power semiconductor package of one of the preceding examples, wherein a thickness of the electrically insulating material over the second side of the second die pad is in the range of 50 μm to 0.5 mm, in particular in the range of 0.1 mm to 0.3 mm, more in particular wherein the thickness is about 0.2 mm.

Example 14 is a method for fabricating a power semiconductor package, the method comprising: providing a leadframe which comprises a first die pad, a second die pad and a plurality of external contacts, wherein the first and second die pads are separated by a first gap, arranging a power semiconductor die on a first side of the first die pad and electrically coupling the power semiconductor die to the first side of the first die pad, arranging a diode on a first side of the second die pad and electrically coupling the diode to the first side of the second die pad, encapsulating the power semiconductor die and the diode with a molded body, the molded body having a first side, an opposite second side and lateral sides connecting the first and second sides, such that a second side of the first die pad opposite the first side of the first die pad is exposed from the second side of the molded body, and completely covering a second side of the second die pad opposite the first side of the second die pad with an electrically insulating material.

Example 15 is the method of example 14, wherein covering the second side of the second die pad with the electrically insulating material comprises molding over the second side of the second die pad.

Example 16 is an apparatus with means for performing the method according to example 14 or 15.

While the disclosure has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the disclosure.

The invention claimed is:

1. A power semiconductor package, comprising:

a leadframe comprising a first die pad, a second die pad and a plurality of external contacts, wherein the first and second die pads are separated by a first gap;

a power semiconductor die arranged on and electrically coupled to a first side of the first die pad;

a diode arranged on and electrically coupled to a first side of the second die pad; and a molded body encapsulating the power semiconductor die and the diode, the molded body having a first side, an opposite second side and lateral sides connecting the first and second sides, wherein a second side of the first die pad opposite the first side of the first die pad is exposed from the second side of the molded body and wherein a second side of the second die pad opposite the first side of the second die pad is completely covered by an electrically insulating material which is different from a mold material of the molded body.

2. The power semiconductor package of claim 1, wherein the first sides of the first and second die pad are coplanar.

3. The power semiconductor package of claim 1, wherein the second side of the first die pad is arranged in a first plane and the second side of the second die pad is arranged in a different, second plane.

4. The power semiconductor package of claim 1, wherein the external contacts are exposed from two opposite lateral sides of the molded body.

5. The power semiconductor package of claim 1, wherein a first one of the external contacts is contiguous with the first die pad and a second one of the external contacts is contiguous with the second die pad.

6. The power semiconductor package of claim 1, wherein the power semiconductor die comprises a first side and an opposite second side, wherein the second side faces the first side of the first die pad; and wherein a first electrical connector couples the first side of the power semiconductor die to the first side of the second die pad.

7. The power semiconductor package of claim 1, wherein the leadframe further comprises a third die pad separated from the first die pad by a second gap and separated from the second die pad by a third gap.

8. The power semiconductor package of claim 7, wherein the diode comprises a first side and an opposite second side, wherein the second side faces the first side of the second die pad, and wherein a second electrical connector couples the first side of the diode to a first side of the third die pad.

9. The power semiconductor package of claim 7, wherein a third one of the external contacts is contiguous with the third die pad.

10. The power semiconductor package of claim 1, wherein the power semiconductor die is coupled to the first die pad in a flip-chip configuration such that a source electrode of the power semiconductor die faces the first die pad.

11. The power semiconductor package of claim 1, wherein a thickness of the electrically insulating material over the second side of the second die pad is in the range of 50 μm to 0.5 mm, in particular in the range of 0.1 mm to 0.3 mm, more in particular wherein the thickness is about 0.2 mm.

12. A method for fabricating a power semiconductor package, the method comprising:

providing a leadframe which comprises a first die pad, a second die pad and a plurality of external contacts, wherein the first and second die pads are separated by a first gap, arranging a power semiconductor die on a first side of the first die pad and electrically coupling the power semiconductor die to the first side of the first die pad, arranging a diode on a first side of the second die pad and electrically coupling the diode to the first side of the second die pad, encapsulating the power semiconductor die and the diode with a molded body, the molded body having a first side, an opposite second side and lateral sides connecting the first and second sides, such that a second side of the first die pad opposite the first side of the first die pad is exposed from the second side of the molded body, and completely covering a second side of the second die pad opposite the first side of the second die pad with an electrically insulating material which is different from a mold material of the molded body.

13. The method of claim 12, wherein covering the second side of the second die pad with the electrically insulating material comprises molding over the second side of the second die pad.

14. A power semiconductor package, comprising:

a leadframe comprising a first die pad, a second die pad and a plurality of external contacts, wherein the first is separated from the second die pad;

a power semiconductor die arranged on a first side of the first die pad, wherein the power semiconductor die includes a first side and an opposing second side facing the first side of the die pad, a diode arranged on a first side of the second die pad, a first electrical connector coupling the first side of the power semiconductor die directly to the first side of the second die pad; and a molded body encapsulating the power semiconductor die and the diode, wherein a second side of the first die pad opposite the first side of the first die pad is exposed from the molded body and wherein a second side of the second die pad opposite the first side of the second die pad is completely covered by the molded body.

15. The power semiconductor package of claim 14, wherein the first sides of the first and second die pad are coplanar.

16. The power semiconductor package of claim 15, wherein the second side of the first die pad is arranged in a first plane and the second side of the second die pad is arranged in a second plane different from the first plane.

17. The power semiconductor package of claim 16, wherein the external contacts are exposed from two opposite lateral sides of the molded body, wherein a first one of the external contacts is contiguous with the first die pad and a second one of the external contacts is contiguous with the second die pad.

18. The power semiconductor package of claim 16, comprising:

a third die pad on the leadframe, separated from the first die pad and the second die pad;

a first electrical connector that couples the first side of the power semiconductor die to the first side of the second die pad; and a second electrical connector that couples the first side of the diode to a first side of the third die pad.

19. The power semiconductor package of claim 16, wherein a third one of the external contacts is contiguous with the third die pad.

20. The method of claim 12, wherein the encapsulating including filling the first gap with an electrically insulating material which is different from a mold material of the molded body.

* * * * *